United States Patent
Iwaki

(10) Patent No.: US 11,395,449 B2
(45) Date of Patent: Jul. 19, 2022

(54) THREE-DIMENSIONAL MOUNTING DEVICE AND THREE-DIMENSIONAL MOUNTING METHOD

(71) Applicant: FUJI CORPORATION, Chiryu (JP)

(72) Inventor: Noriaki Iwaki, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 378 days.

(21) Appl. No.: 16/487,998

(22) PCT Filed: Mar. 8, 2017

(86) PCT No.: PCT/JP2017/009257
§ 371 (c)(1),
(2) Date: Aug. 22, 2019

(87) PCT Pub. No.: WO2018/163322
PCT Pub. Date: Sep. 13, 2018

(65) Prior Publication Data
US 2020/0037478 A1    Jan. 30, 2020

(51) Int. Cl.
*H05K 13/04* (2006.01)
*H05K 13/08* (2006.01)
*H05K 13/00* (2006.01)

(52) U.S. Cl.
CPC ....... *H05K 13/0469* (2013.01); *H05K 13/089* (2018.08); *H05K 13/0069* (2013.01); *Y10T 29/53174* (2015.01); *Y10T 29/53265* (2015.01)

(58) Field of Classification Search
CPC ........ H05K 3/0085; H05K 3/34; H05K 3/341; H05K 3/3431; H05K 13/0061;
(Continued)

(56) References Cited

U.S. PATENT DOCUMENTS 4,959,898 A    10/1990  Landman et al.
2010/0050429 A1*  3/2010  Maenishi ............. H05K 1/0269
                                                29/832
(Continued)

FOREIGN PATENT DOCUMENTS

EP    2 943 051 A1    11/2015
JP    63-139679 A      6/1988
(Continued)

OTHER PUBLICATIONS

International Search Report dated Jun. 6, 2017 in PCT/JP2017/009257 filed on Mar. 8, 2017.
Extended European Search Report dated Feb. 14, 2020 in Patent Application No. 17899660.9, 10 pages.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

The three-dimensional mounting device includes a supporting section capable of fixing a processing target, an application section for applying a viscous fluid to the processing target, a mounting section for arranging a component on the processing target, an imaging section for imaging the processing target, and a control section for controlling the processing section including the supporting section, the application section, the mounting section, and the imaging section. One or more of the supporting section, the application section, the mounting section, and the imaging section has multiple tilt axes and is capable of tilting the processing target and/or the processing section in multiple directions. The control section performs coordinate correction using the circuit pattern on the forming surface as a reference position, and arranges the component on the mounting section.

6 Claims, 10 Drawing Sheets

(58) Field of Classification Search
CPC .............. H05K 13/0069; H05K 13/04; H05K 13/0404; H05K 13/0408; H05K 13/0409; H05K 13/041; H05K 13/046; H05K 13/0465; H05K 13/0469; H05K 13/08; H05K 13/0812; H05K 13/0813; H05K 13/0815; H05K 13/0817; H05K 13/089; Y10T 29/49124; Y10T 29/4913; Y10T 29/49131; Y10T 29/53174; Y10T 29/53178; Y10T 29/53191; Y10T 29/53261; Y10T 29/53265
See application file for complete search history.

(56) References Cited

U.S. PATENT DOCUMENTS

| | | | |
|---|---|---|---|
| 2013/0283594 A1 | 10/2013 | Iwaki et al. | |
| 2018/0243869 A1* | 8/2018 | Mizuoka | H05K 13/0404 |
| 2019/0037739 A1* | 1/2019 | Okazaki | H05K 13/0812 |

FOREIGN PATENT DOCUMENTS

| | | | |
|---|---|---|---|
| JP | 2-144704 A | 6/1990 | |
| JP | 2009-94283 A | 4/2009 | |
| JP | 2015-99863 A | 5/2015 | |
| JP | 2015-226040 A | 12/2015 | |
| JP | 2016-127187 A | 7/2016 | |
| WO | WO 2012/117790 A1 | 9/2012 | |

* cited by examiner

THREE-DIMENSIONAL MOUNTING DEVICE AND THREE-DIMENSIONAL MOUNTING METHOD

TECHNICAL FIELD

The present disclosure relates to a three-dimensional mounting device and a three-dimensional mounting method.

BACKGROUND ART

Conventionally, as a three-dimensional mounting device, for example, there has been proposed a device in which a dispenser is oriented along a normal line of a tangent plane at a target point of a workpiece, the dispenser is moved along the normal line toward the target point to apply a conductive paste, the workpiece is rotated around a vertical axis such that the target point faces a suction nozzle, and the suction nozzle is moved along the normal line to mount a chip component on the target point (for example, see patent literature 1). In such a device, chip components can be three-dimensionally mounted on workpieces of various shapes.

CITATION LIST

Patent Literature

Patent literature 1: JP-A-2016-127187

SUMMARY

In the mounting device described in patent literature 1, a reference mark is arranged on each mounting surface of a workpiece, and a deviation of inclination of the workpiece or the like is corrected based on the reference mark. However, there is a problem in that the more complicated the shape of the three-dimensional object, such as a large number of mounting surfaces of the workpiece, the more difficult it is to arrange a reference mark.

The present disclosure has been made in view of such problems, and a main object thereof is to provide a three-dimensional mounting device and a three-dimensional mounting method capable of arranging components on a surface of a three-dimensional object with higher accuracy.

The present disclosure employs the following means to achieve the above object.

A three-dimensional mounting device of the present disclosure is for applying a viscous fluid to and arranging components on a three-dimensional processing target having multiple forming surfaces on which a circuit pattern is formed, the three-dimensional mounting device including:
a supporting section configured to fix the processing target;
an applying section configured to apply the viscous fluid to the processing target;
a mounting section configured to arrange the components on the processing target; an imaging section configured to capture an image of the processing target; and
a control section configured to control a processing section including the supporting section, the applying section, the mounting section, and the imaging section,
wherein
at least one of the supporting section, the applying section, the mounting section, and the imaging section has multiple tilt axes such that one or both of the processing target and the processing section is able to tilt in multiple directions, and the control section is configured to cause the supporting section to support the processing target and to perform:
  imaging processing of fixing the processing target such that one of the forming surfaces of the processing target that is being supported by the supporting section becomes an imaging surface, the forming surface being in a state without anything having been applied to it, and causing the imaging section to image the forming surface,
  application processing of fixing the processing target such that one of the forming surfaces of the processing target that is being supported by the supporting section becomes an application surface, and causing the applying section to apply the viscous fluid to the forming surface, and
  mounting processing of fixing the processing target such that one of the forming surfaces of the processing target that is being supported by the supporting section becomes a mounting surface, performing coordinate correction using a circuit pattern of the forming surface imaged by the imaging section as a reference position, and causing the mounting section to arrange the component at an arrangement position on the circuit pattern on the forming surface on which the viscous fluid was applied.

With this device, imaging processing is performed of fixing the processing target such that one of the forming surfaces of the processing target that is being supported by the supporting section becomes an imaging surface, the forming surface being in a state without anything having been applied to it, and imaging the forming surface. Similarly, with this device, application processing is performed of fixing the processing target such that one forming surface becomes an application surface, and applying a viscous fluid. Further, with this device, mounting processing is performed of fixing the processing target such that one of the forming surfaces of the processing target that is being supported by the supporting section becomes a mounting surface, performing coordinate correction using a circuit pattern of the forming surface imaged by the imaging section as a reference position, and arranging a component at an arrangement position on which the viscous fluid was applied. Although the circuit pattern cannot be recognized after the viscous fluid has been applied, with this device, since the application processing and the mounting processing can be performed, the circuit pattern can be imaged before the application of the viscous fluid, and this image can be used for the component arrangement after the application of the viscous fluid. With this device, since the circuit pattern on the forming surface is used as the reference position, the coordinate correction of the arrangement position of the component can be performed without arranging a special reference mark. Thus, the device allows the component to be more accurately arranged on the surface of a three-dimensional object. Here, the "viscous fluid" includes, for example, a solder paste, a conductive paste, an adhesive for fixing a component, grease, and the like.

DESCRIPTION OF EMBODIMENTS

Figure 1:
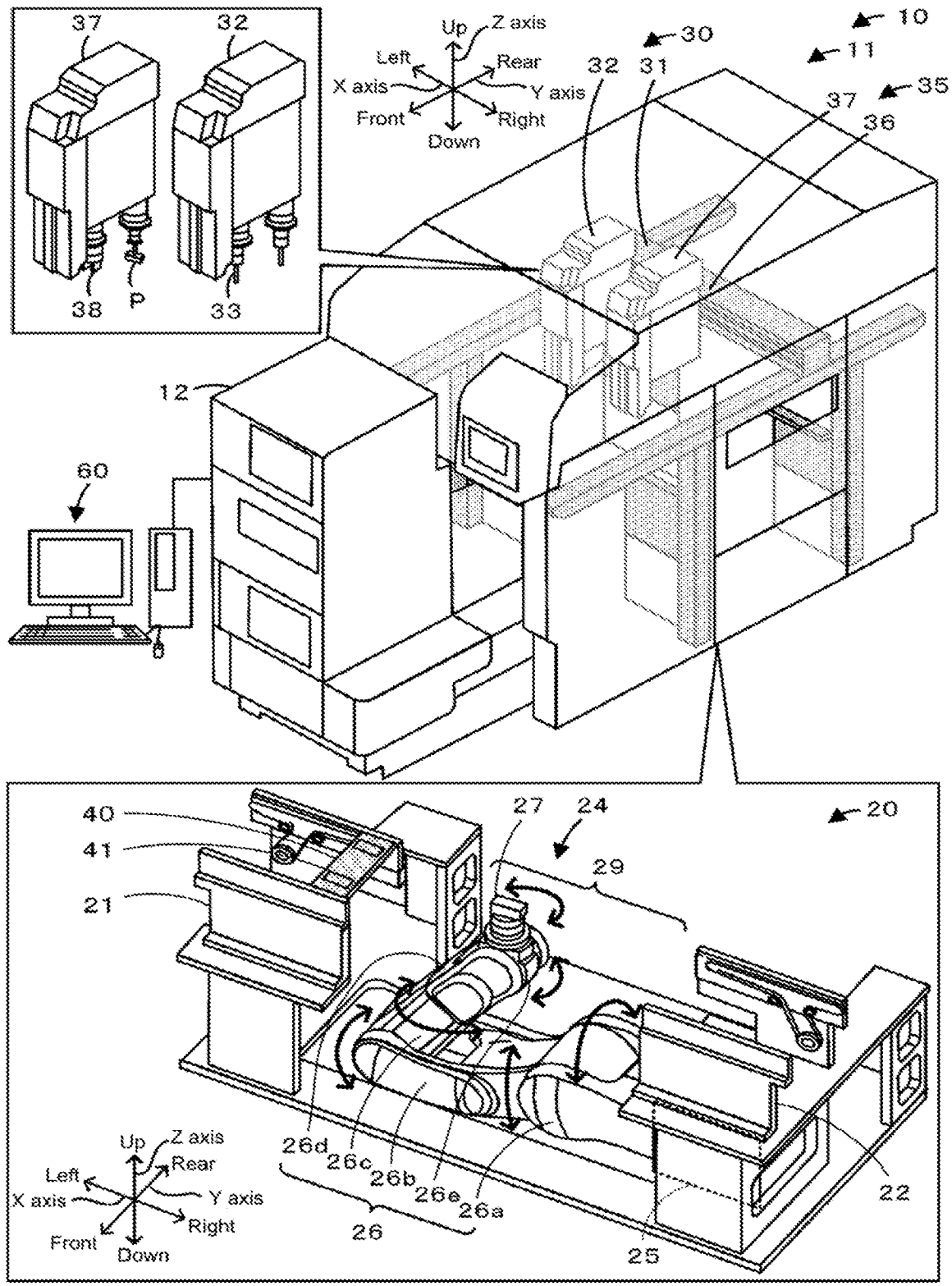
FIG. 1 is a schematic view of mounting system 10.
Figure 2:
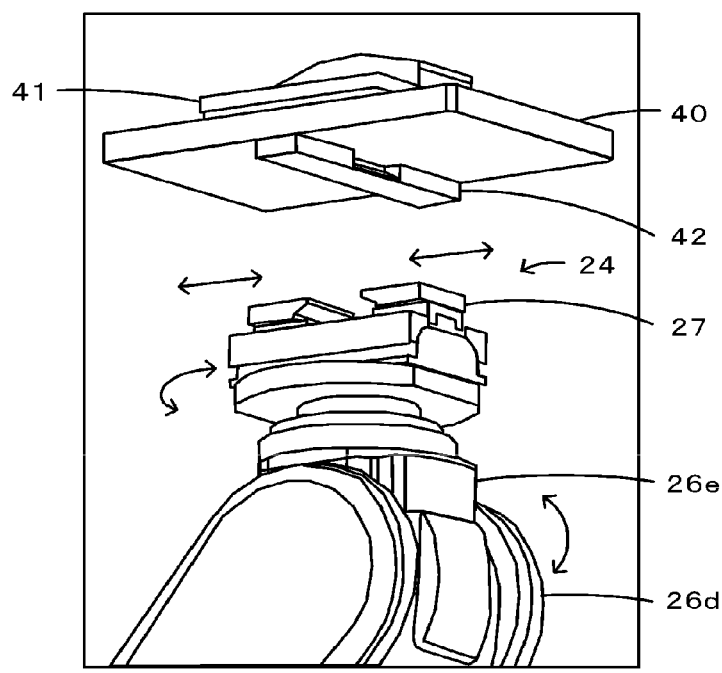
FIG. 2 illustrates the configuration of robot-side attachment section 27 and conveyance pallet 40.
Figure 3:
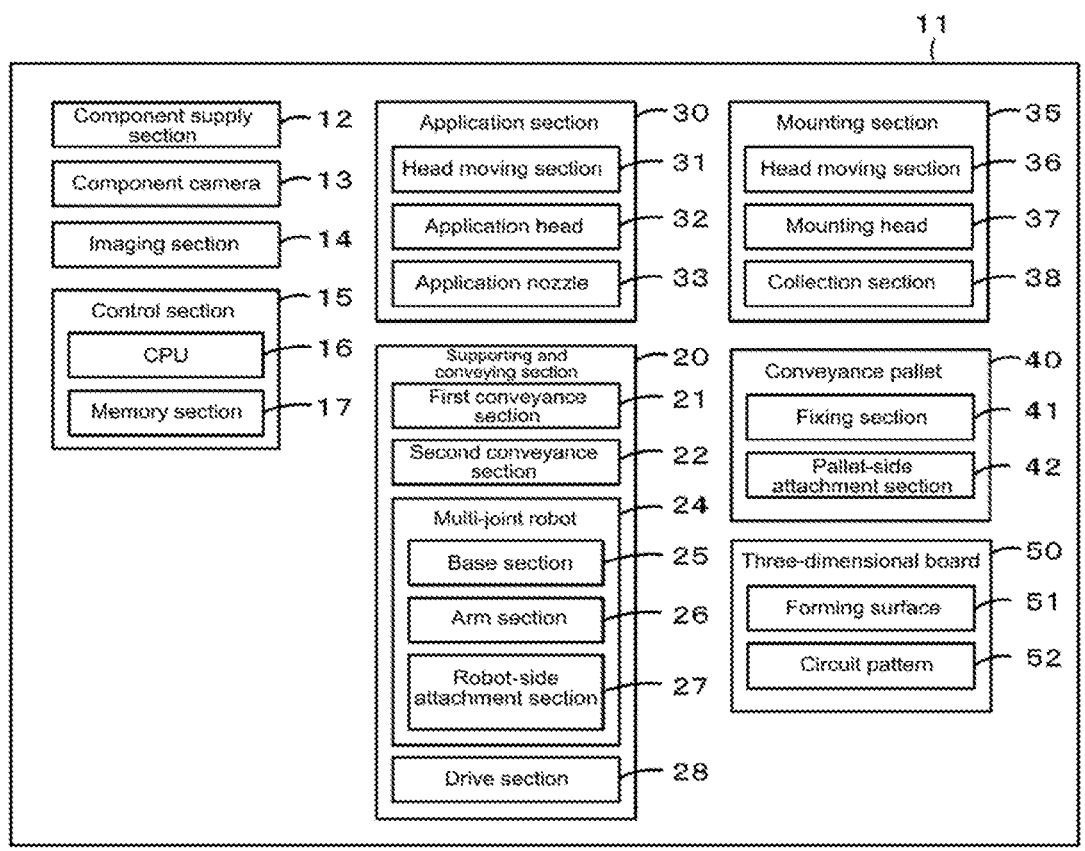
FIG. 3 is a block diagram of the configuration of three-dimensional mounting device 11.
Figure 4:
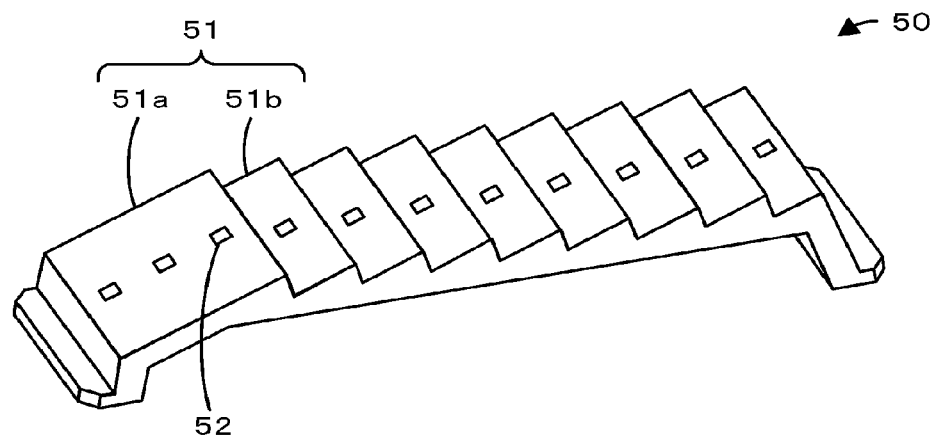
FIG. 4 illustrates an example of three-dimensional board 50 as a processing target.
Figure 5:
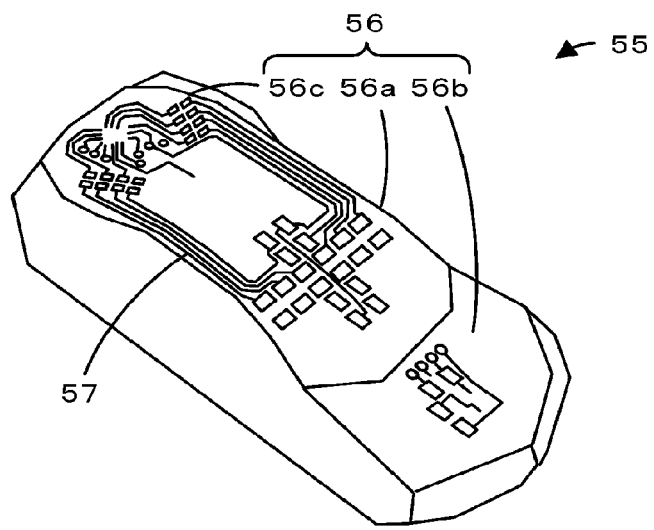
FIG. 5 illustrates an example of three-dimensional board 55 as a processing target.
Figure 6:
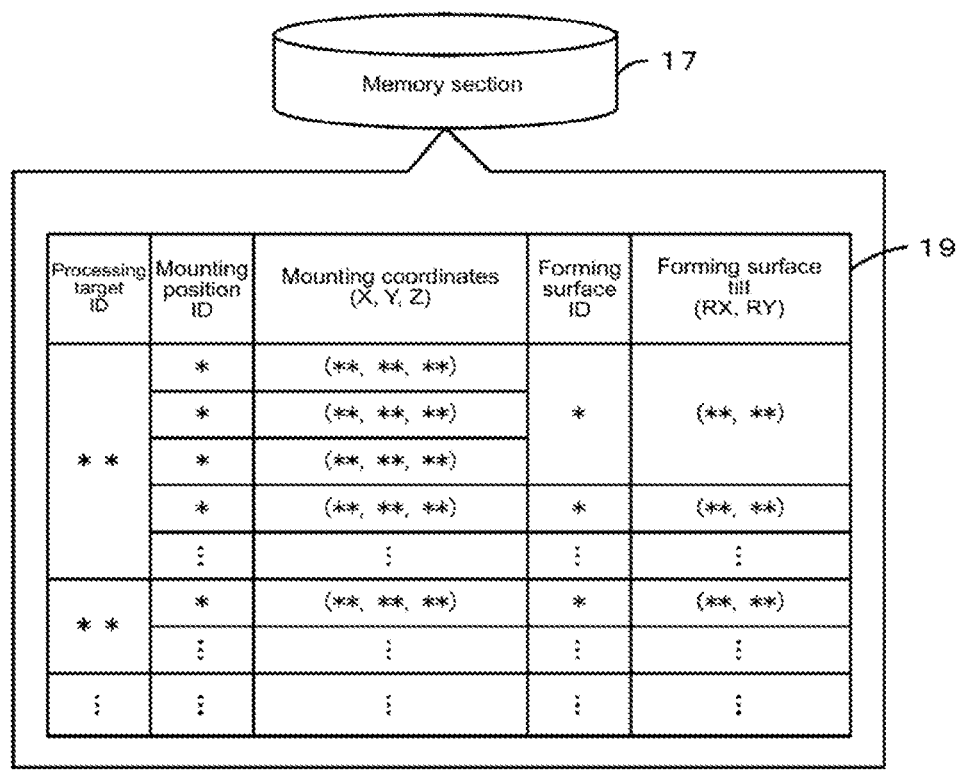
FIG. 6 illustrates three-dimensional data 19 of a processing target memorized on memory section 17.

Hereinafter, an embodiment will be described with reference to the figures. FIG. 1 is a schematic illustration of mounting system 10 that is an example of the present disclosure. FIG. 2 illustrates the configuration of robot-side attachment section 27 of multi-joint robot 24 and conveyance pallet 40. FIG. 3 is a block diagram of the configuration of three-dimensional mounting device 11. FIGS. 4 and 5 illustrate three-dimensional boards 50 and 55, which are example of a processing target. FIG. 6 illustrates three-dimensional data 19 of a processing target memorized on memory section 17. As shown in FIG. 1, mounting system 10 includes three-dimensional mounting device 11, a reflow oven (not shown), and management computer (PC) 60. Three-dimensional mounting device 11 is a device for applying a viscous fluid to and arranging members such as components P on three-dimensional boards 50 and 55 (see FIGS. 4 and 5) as three-dimensional processing targets. Note that the viscous fluid includes a solder paste, a conductive paste, an adhesive, grease, and the like. A reflow oven is a device for performing reflow processing of heating a three-dimensional board on which components are arranged on a viscous fluid. Management PC 60 stores mounting condition information. Mounting condition information defines which components are mounted on the three-dimensional board in which order, the number of such three-dimensional boards required to be produced, and the like. Mounting condition information defines which components are mounted on the three-dimensional board in which order, the number of such three-dimensional boards required to be produced, and the like. The mounting condition information includes three-dimensional data such as the application position of the viscous fluid to be processed by three-dimensional mounting device 11 and the shape and position of the circuit pattern used as the arrangement position of the component. In the present embodiment, left-right directions (X axis), front-rear directions (Y axis), and up-down directions (Z axis) are set as shown in FIG. 1.

As shown in FIG. 4, three-dimensional board 50 as a processing target is a three-dimensional object having multiple forming surface 51 including forming surface 51a and forming surface 51b on which circuit pattern 52 is formed. Three-dimensional board 50 has stepped forming surface 51a and forming surface 51b, and the like, and a mounting position (arrangement position) where the component P is to be arranged is defined on these surfaces. Three-dimensional board 50 has a shape in which forming surface 51a and forming surface 51b are inclined with respect to the horizontal plane when three-dimensional board 50 is loaded on a horizontal surface. In addition, when three-dimensional board 50 is loaded on a horizontal surface, the mounting position of forming surface 51a and the mounting position of forming surface 51b are at a different height. As shown in FIG. 5, three-dimensional board 55 is a three-dimensional object having multiple forming surfaces 56 including forming surfaces 56a, 56b, 56c, and the like on which a circuit pattern 57 is formed. Three-dimensional boards 50 and 55 are collectively referred to as three-dimensional boards, forming surfaces 51 and 56 are collectively referred to as forming surfaces, and circuit patterns 52 and 57 are collectively referred to as circuit patterns. In addition, for a forming surface 56 with a curved surface on which the circuit pattern 57 is formed, even though the curved surface is the same, when the slope of the three-dimensional board 55 must be changed to perform application and mounting due to differences in heights and angles, this shall be treated as multiple forming surfaces 56. The processing target may have a curved surface or a flat surface, and the mounting position may be on any of the top side, a side surface side, or the bottom side.

Three-dimensional mounting device 11 is a device for performing processing of applying a viscous fluid to and processing of mounting components P on three-dimensional boards 50 and 55 having a three-dimensional mounting surface. Three-dimensional mounting device 11 includes component supply section 12, component camera 13, imaging section 14, control section 15, supporting and conveying section 20, application section 30, mounting section 35, and the like.

Component supply section 12 is a section that supplies components P to mounting section 35. Component supply section 12 includes, for example, a feeder on which tape holding components P is mounted, a tray on which components P are mounted in an array, and the like. Component camera 13 captures an image of one or more components P picked up by mounting head 37 of mounting section 35 from below. A range above component camera 13 is an imaging range. Imaging section 14 captures an image of a three-dimensional board which is a processing target. Imaging section 14 is provided for example, on the underside of either application head 32 or mounting head 37, and moves inside the device in the XY direction as application head 32 or mounting head 37 moves. Imaging section 14 has an imaging range below it.

Control section 15 is configured as a microprocessor centered on CPU 16, and includes storage section 17 for storing various data. Control section 15 exchanges information with and controls component supply section 12, component camera 13, imaging section 14, supporting and conveying section 20, application section 30, mounting section 35, and the like. With three-dimensional mounting device 11, control section 15 performs imaging processing of causing imaging section 14 to image a forming surface of a three-dimensional board, application processing of causing application section 30 to apply the viscous fluid to the forming surface of the three-dimensional board, and mounting processing of causing mounting section 35 to arrange component P on the forming surface of the three-dimensional board. In addition, control section 15 is set to perform at least one of: a surface batch mode in which the processing of performing the imaging processing, the application processing, and the mounting processing for a single forming surface are performed in order with respect to multiple of the forming surfaces, a processing batch mode in which after performing imaging processing with respect to multiple of the forming surfaces, application processing is performed with respect to the multiple forming surfaces, then mounting processing is performed with respect to the multiple forming surfaces, and a combined mode in which the surface batch mode and the processing batch mode are mixed.

As shown in FIG. 6, mounting condition information including three-dimensional shape data 19 is memorized in memory section 17. Three-dimensional mounting device 11 acquires the mounting condition information from management PC 60 by communication, and memorizes the mounting condition information in memory section 17. Three-dimensional data 19 is data including information on a three-dimensional structure of a three-dimensional object such as the three-dimensional boards 50 and 55, which is created by CAD or the like, for example. Three-dimensional data 19 includes, for example, three-dimensional coordinates (X, Y, Z) based on a specified origin as a reference, information on the direction of the outer surface at those coordinates (for example, normal vector), and the like. Further, three-dimensional data 19 includes identification information (ID) of the processing target, a mounting position ID of the processing target, mounting coordinates (X, Y, Z), identification information (ID) of the forming surface including the mounting position, inclination information including inclination RX due to rotation of the forming surface including the mounting position in the X axis direction as the center axis, inclination information including inclination RY due to rotation with the Y axis direction as the center axis, and the like.

Supporting and conveying section 20 is a unit that can convey a three-dimensional board and fix the three-dimensional board by adjusting an inclination angle of the three-dimensional board. As shown in FIG. 1, supporting and conveying section 20 includes first conveyance section 21, second conveyance section 22, multi-joint robot 24, and drive section 28. First conveyance section 21 is a conveyor that conveys conveyance pallet 40 on which the three-dimensional board is fixed from the entrance of the device to the loading position. First conveyance section 21 has a pair of conveyor belts which are provided separated in the front-rear direction of FIG. 1 and span first conveyance section 21 in the left-right direction. Conveyance pallet 40 is conveyed by the conveyor belt. Second conveyance section 22 is a conveyor that discharges conveyance pallet 40 (pedestal) holding the three-dimensional board from the discharge position to the outlet of the device. Second conveyance section 22 has the same configuration as first conveyance section 21. In supporting and conveying section 20, movable space 29 in which multi-joint robot 24 is disposed and operates is formed below the moving regions of application head 32 and mounting head 37 and between first conveyance section 21 and second conveyance section 22.

As shown in FIGS. 1 to 3, conveyance pallet 40 includes fixing section 41 for fixing a three-dimensional board and pallet-side attachment section 42 held by arm section 26. Fixing section 41 may be any mechanism as long as it fixes the three-dimensional board, for example, a clamp mechanism that clamps the three-dimensional board by a spring force or a mechanism that fixes the three-dimensional board with a screw. Pallet-side attachment section 42 may be a clamp plate removably fixed to conveyance pallet 40. The clamp plate is formed with a groove or a concave portion to be gripped by robot-side attachment section 27.

Multi-joint robot 24 is a supporting section capable of fixing a three-dimensional board. Multi-joint robot 24 grips conveyance pallet 40 to which the three-dimensional board is fixed, and moves conveyance pallet 40 to a loading position, a processing position, and a discharge position. Multi-joint robot 24 has multiple tilt axes and is capable of tilting the three-dimensional board in multiple directions, and maintains the three-dimensional board in an attitude changeable with respect to application head 32 and mounting head 37. The larger the quantity of tilt axes, the easier it is to change the attitude of the three-dimensional board, and it is preferable that there are at least four tilt axes. Multi-joint robot 24 has six tilt axes. Multi-joint robot 24 has base section 25, arm section 26, and robot-side attachment section 27. Base section 25 is fixed to the device housing in a state supporting arm section 26. Multi-joint robot 24 is a vertical multi-joint robot, and the axial direction of base portion 25 is fixed to a direction along a horizontal direction, for example, a direction (X axis) along a moving direction of the three-dimensional board. That is, supporting and conveying section 20 includes a vertical multi-joint robot placed horizontally. By arranging multi-joint robot 24 in this manner, it is possible to tilt the three-dimensional board in the limited movable space 29 or to lower the three-dimensional board to a position lower than the conveyance height of first conveyance section 21 or second conveyance section 22.

Arm section 26 has first arm 26a, second arm 26b, third arm 26c, fourth arm 26d, and fifth arm 26e. First arm 26a is disposed on base section 25 so as to be rotatable about the X axis. Second arm 26b is pivotally supported by first arm 26a so as to be able to swing mainly in the vertical direction. Third arm 26c is pivotally supported by second arm 26b so as to be able to swing mainly in the left-right direction. Fourth arm 26d is arranged on third arm 26c so as to be rotatable about the main axis of third arm 26c. Fifth arm 26e is pivotally supported by fourth arm 26d so as to be able to swing mainly in the left-right direction. Fifth arm 26e is provided with robot-side attachment section 27 that is rotatable about its main axis. Robot-side attachment section 27 is a mechanical chuck provided at the distal end of arm section 26 and that grips and fixes pallet-side attachment section 42 (clamp plate). Robot-side attachment section 27 is opened and closed by a pressure supplied from the main body. Drive section 28 includes, for example, a motor for driving the conveyor belts of first conveyance section 21 and second conveyance section 22, a motor for rotating or swinging each member of arm section 26, and the like. Multi-joint robot 24 transports the three-dimensional board between the loading position, the processing position, and the discharge position in a state mounted on conveyance pallet 40. At this time, multi-joint robot 24 grips pallet-side attachment section 42 of conveyance pallet 40 in first conveyance section 21, transfers conveyance pallet 40, and releases the pallet-side attachment section 42 at second conveyance section 22.

Application section 30 is an application unit that applies a viscous fluid to a three-dimensional board fixed to supporting and conveying section 20. Application section 30 includes head moving section 31, application head 32, and application nozzle 33. Head moving section 31 is provided with sliders that move in XY directions guided by guide rails and motors that drive the sliders. Application section 30 is configured as an XY robot that moves application head 32 as a processing head in the XY plane direction. Application nozzle 33 is detachably mounted on the lower surface side of application head 32. Application nozzle 33 is a nozzle for supplying a predetermined amount of the viscous fluid from the tip end of application nozzle 33 by pressure being applied to the housing section that houses the viscous fluid.

Mounting section 35 is a mounting unit that collects component P from component supply section 12 and arranges the component P on a three-dimensional board fixed to supporting and conveying section 20. Mounting section 35 includes head moving section 36, mounting head 37, and collection section 38. Head moving section 36 is provided with sliders that move in XY directions guided by guide rails and motors that drive the sliders. Mounting section 35 is configured as an XY robot that moves mounting head 37 in the XY plane direction. Collection section 38 is a member that is removably mounted on the lower surface side of mounting head 37 and that collects component P. Collection section 38 may be a suction nozzle for collecting the component P using negative pressure, or may be a mechanical chuck for mechanically gripping the component P. Mounting head 37 is configured to be capable of holding one or more collection sections 38. Head moving section 36 may share a part of the slider with head moving section 31. Application head 32 and mounting head 37 may have the same structure, and application nozzle 33 and collection section 38 may be freely attached as tools.

Figure 7:
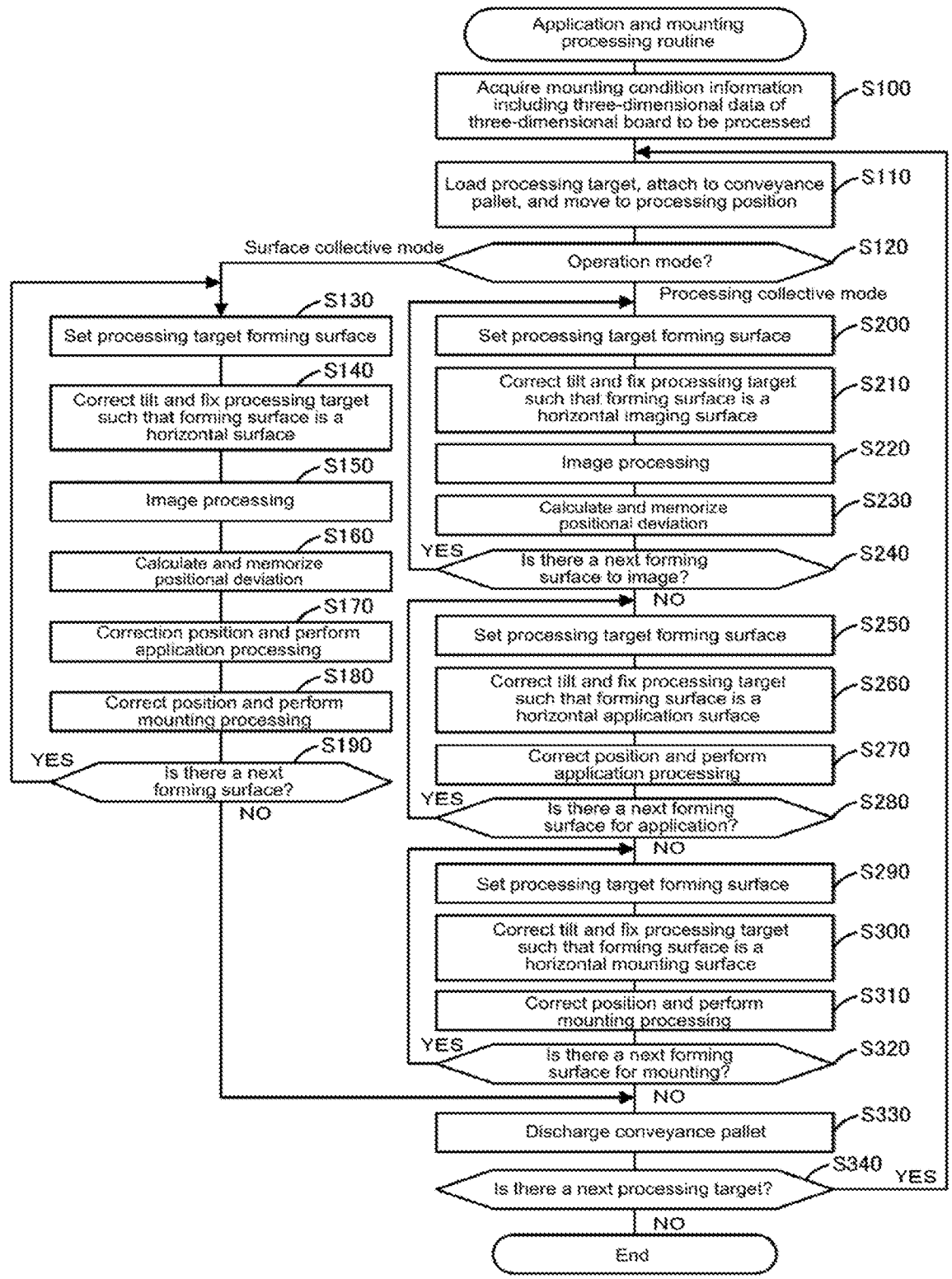
FIG. 7 is a flowchart showing an example of an application and mounting processing routine.

Next, operation of mounting system 10 of the present embodiment configured as described above, in particular, the application process and the mounting process executed by three-dimensional mounting device 11 will be described. FIG. 7 is a flowchart showing an example of application and mounting processing executed by CPU 16 of control section 15. This routine is memorized in memory section 17 and is executed based on a mounting start input from an operator. Here, for simplicity of description, a surface batch mode and a processing batch mode are performed selectively, but a combined mode may also be performed.

Figure 8:
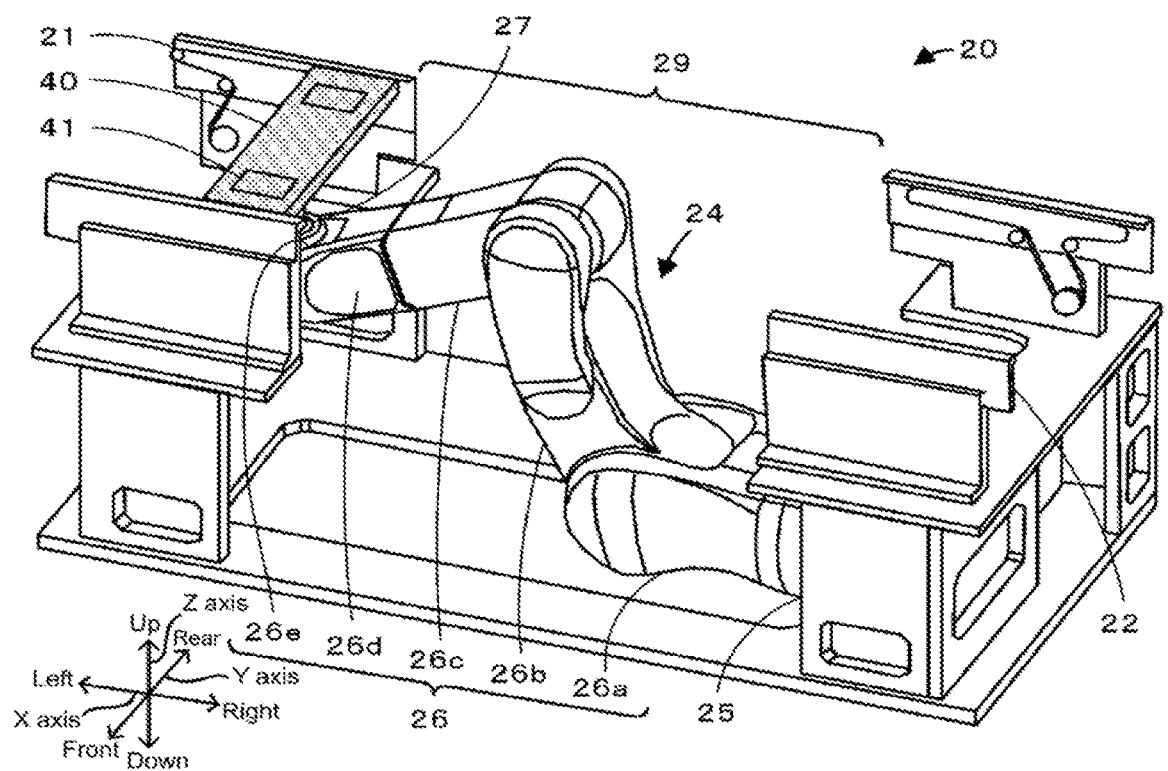
FIG. 8 illustrates supporting and conveying section 20 on which conveyance pallet 40 is loaded at a loading position.
Figure 9:
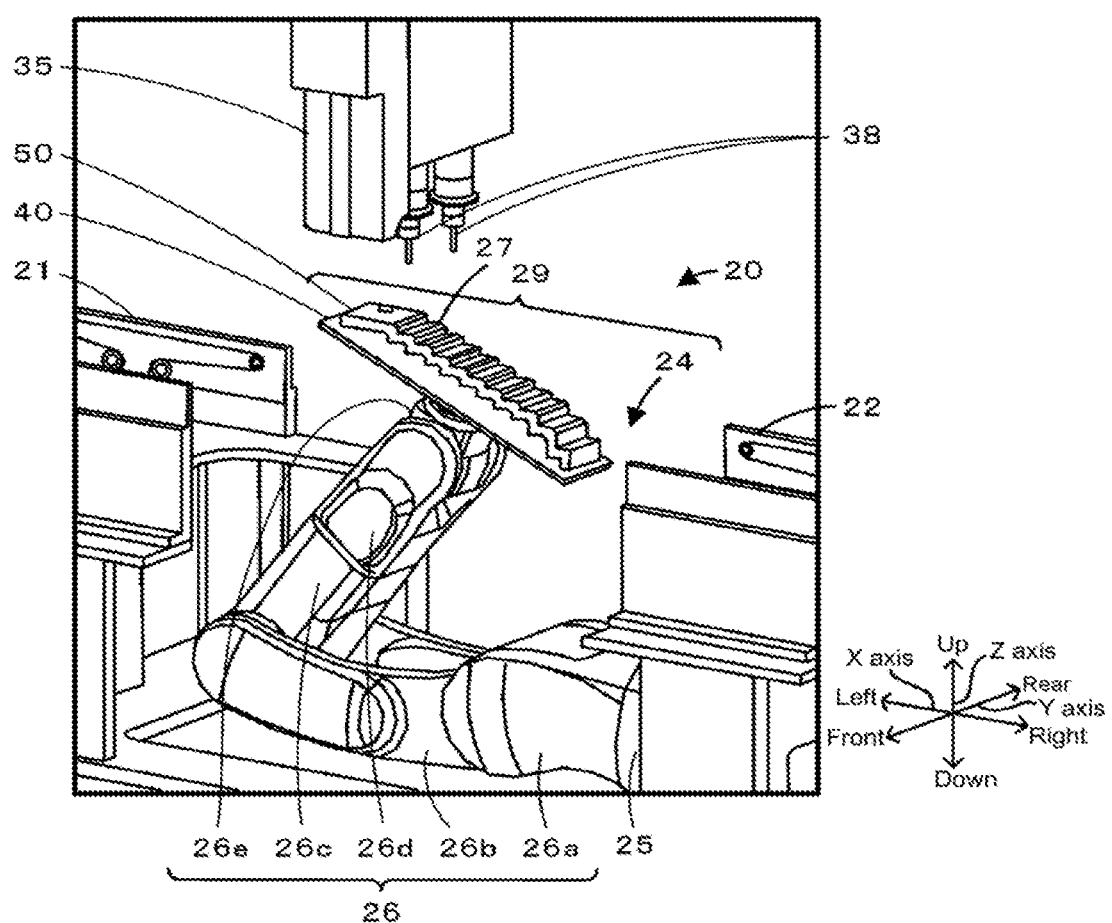
FIG. 9 illustrates supporting and conveying section 20 on which conveyance pallet 40 is fixed at a processing position.

When the routine is initiated, CPU 16 first acquires mounting condition information including three-dimensional data of three-dimensional board to be processed from management PC 60 (S100), transports conveyance pallet 40 in which the three-dimensional board is fixed, and mounts conveyance pallet 40 at the processing position (S110). FIG. 8 illustrates supporting and conveying section 20 on which conveyance pallet 40 is loaded at an introduction position. FIG. 9 illustrates supporting and conveying section 20 on which conveyance pallet 40 is fixed at a processing position. CPU 16 controls first conveyance section 21 to move conveyance pallet 40 to the loading position, and controls multi-joint robot 24 so that robot-side attachment section 27 grips pallet-side attachment section 42 below conveyance pallet 40 (refer to FIG. 8). Next, CPU 16 controls multi-joint robot 24 to move conveyance pallet 40 to the processing position, which is at the center of movable space 29 (refer to FIG. 9).

Figure 10:
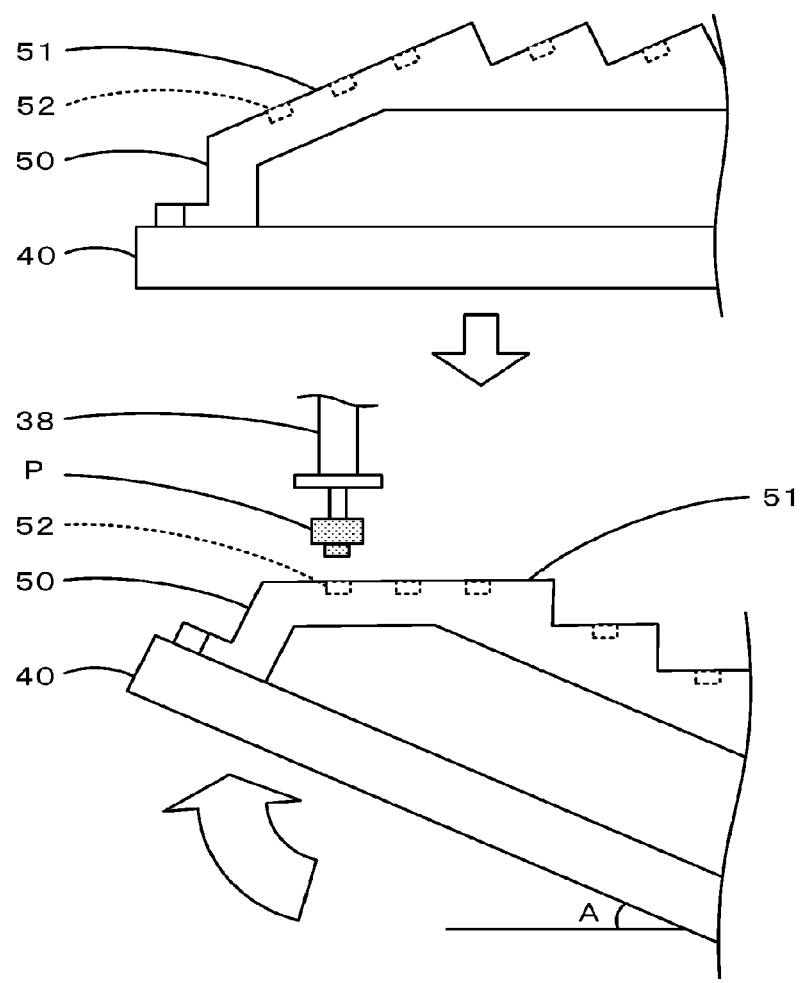
FIG. 10 illustrates mounting of component P after correcting the orientation (tilt) of three-dimensional board 50.

Next, CPU 16 determines which of the operation modes is set (S120). When the set mode is the surface batch mode, CPU 16 sets the surface on which the viscous fluid is to be applied and the component P is to be arranged (S130). For example, CPU 16 can set the forming surface of the processing target based on the three-dimensional data 19 of the processing target including the mounting order. Next, CPU 16 corrects the inclination of the three-dimensional board and fixes the three-dimensional board such that a surface on which the viscous fluid has not been applied becomes the horizontal imaging surface, the application surface, and the mounting surface (S140). CPU 16 fixes the processing target to the multi-joint robot 24 based on the inclination of the forming surface included in the three-dimensional data 19 of the processing target such that the forming surface becomes a horizontal plane. At this time, CPU 16 controls multi-joint robot 24 such that the forming surface of the processing target becomes a specified mountable height. FIG. 10 illustrates mounting of component P after correcting the orientation (tilt) of three-dimensional board 50. As shown in FIG. 10, when forming surface 51 is inclined, the angle of conveyance pallet 40 is corrected such that forming surface 51 is horizontal. It should be noted that the term "horizontal" may be used to indicate a change in the attitude of the three-dimensional board so that the position where the component P is arranged becomes horizontal, and when the forming surface is a curved surface, the attitude of the three-dimensional board may be changed such that a central portion, a portion where the arrangement density of components P is high, or the like becomes horizontal.

Figure 11:
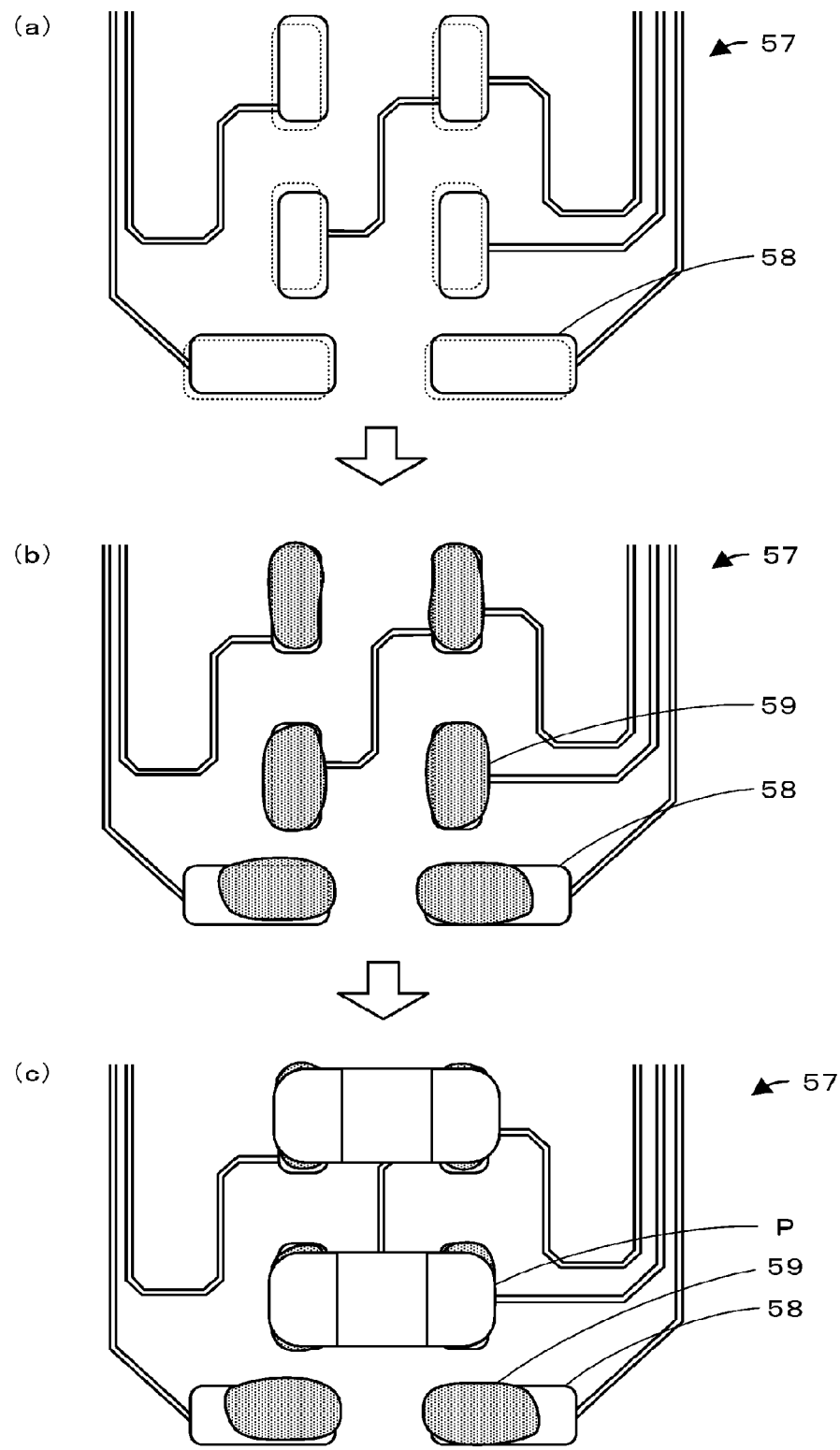
FIG. 11 illustrates position correction using circuit pattern 57.

Next, CPU 16 causes imaging section 14 to image the forming surface to be processed (S150), calculates the positional deviation of the circuit pattern using the circuit pattern of the forming surface included in the captured image as a reference position, and memorizes the positional deviation (S160). Here, CPU 16 calculates the positional deviation using the electrode pads formed at the arrangement positions of the components as the reference positions. Further, when applying viscous fluids to multiple positions on one forming surface, CPU 16 calculates the positional deviation amounts of the respective circuit patterns (electrode pads) at the respective application positions, using the circuit patterns as the respective reference positions. Next, CPU 16 performs position correction (coordinate correction) using the positional deviation calculated using the circuit pattern as the reference position, and causes application section 30 to apply the viscous fluid (S170). FIG. 11 illustrates position correction using circuit pattern 57; FIG. 11A illustrates imaging processing; FIG. 11B illustrates application processing; FIG. 11C illustrates mounting processing. As shown in FIG. 11A, the actual circuit pattern 57 including electrode pads 58 and the like may be formed at a position deviated from the design position (refer to the dotted lines). Further, deviation correction is generally performed with reference to a reference mark on a flat board. However, with a three-dimensional object, it may not be possible to secure regions in which reference marks are provided on all the forming surfaces. In the application processing, CPU 16 applies viscous fluid 59 by correcting coordinates of the application position using the positions of the electrode pads obtained by imaging as the reference positions instead of the reference marks (FIG. 11B). Further, the formation of the circuit pattern on the three-dimensional object may be performed by writing by a single stroke with a laser or the like, and may pass through multiple forming surfaces, and for example, high positional accuracy may not be expected in some cases, even for adjacent electrodes. Here, CPU 16 corrects the coordinates of the application position using the positions of the respective electrodes pads that were actually detected.

Next, CPU 16 performs position correction (coordinate correction) using the positional deviation calculated using the circuit pattern as the reference position, and causes mounting section 35 to arrange the component P on the three-dimensional board (S180). In the mounting processing, similarly to the application processing, CPU 16 corrects the coordinate of the mounting position using, instead of the reference marks, the position of the electrode pads obtained by imaging the forming surface on which the viscous fluid has not been applied as the reference position and arranges component P on viscous fluid 59 (FIG. 11C). Further, when arranging the components P at multiple positions on one forming surface, CPU 16 corrects the coordinates of the mounting position by using the circuit patterns (electrode pads) at the respective arrangement positions as the respective reference positions. Continuing, CPU 16 determines whether there is an unprocessed next forming surface (S190), and if there is a next forming surface, executes S130 and subsequent processes. As described above, in the surface batch mode, since imaging processing, application processing, and mounting processing are performed in a state in which one forming surface is fixed, it is easy to secure positional accuracy.

On the other hand, when the processing batch mode is set in S120, CPU 16 executes a processing batch mode of performing imaging processing on all the forming surfaces, detecting all positional deviations, and then performing application processing on all the forming surfaces, and mounting processing on all the forming surfaces (S200 to S320). In the processing batch mode, each process is performed in the same manner as in the surface batch mode, thus a detailed description thereof is omitted. When the processing batch mode is started, CPU 16 sets a forming surface as a processing target for performing the imaging processing (S200), corrects and fixes the inclination of the three-dimensional board so that the forming surface becomes a horizontal imaging surface (S210), and causes imaging section 14 to execute the imaging processing (S220). Next, CPU 16 calculates and memorizes the positional deviation of the circuit pattern using the circuit pattern of the forming surface as a reference position (S230), and determines whether there is a next forming surface that has not been imaged (S240). When there is a next forming surface, CPU 16 executes processing from S200. On the other hand, when there is no next forming surface, that is, when all forming surfaces have been imaged, CPU 16 sets a forming surface as a target for application processing (S250), and fixes the three-dimensional board by correcting the inclination of the three-dimensional board so that the forming surface becomes a horizontally applied surface (S260). Continuing, CPU 16 performs position correction (coordinate correction) using the positional deviation amounts of the forming surfaces calculated and memorized in advance, and causes application section 30 to apply the viscous fluid (S270).

Next, CPU 16 determines whether there is a next forming surface for which application has not been performed (S280), and if there is a next forming surface, executes processing from S250. On the other hand, when there is no subsequent forming surface, that is, when application has been performed on all of the forming surfaces, CPU 16 sets the forming surface as a target for mounting processing (S290), and fixes the three-dimensional board by correcting the inclination of the three-dimensional board so that the forming surface becomes a horizontally applied surface (S300). Continuing, CPU 16 performs position correction (coordinate correction) using the positional deviation amounts of the forming surfaces calculated and memorized in advance, and arranges component P at mounting section 35 (S310). Then, CPU 16 determines whether there is a next forming surface for which mounting has not been performed (S320), and if there is a next forming surface, executes processing from S290. On the other hand, when there is no next forming surface in S320 or S190, that is, when mounting is complete for all the forming surfaces, CPU 16 causes conveyance pallet 40 to be discharged (S330).

Figure 12:
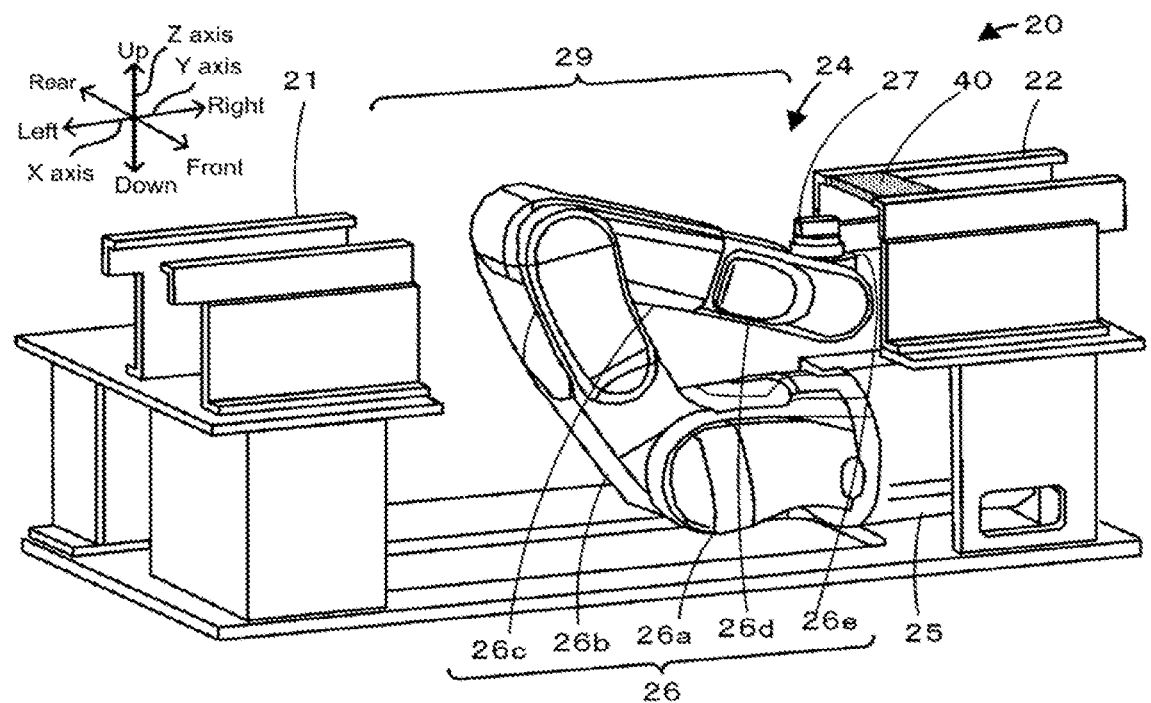
FIG. 12 illustrates supporting and conveying section 20 from which conveyance pallet 40 is released at a discharge position.

FIG. 12 illustrates supporting and conveying section 20 from which conveyance pallet 40 is released at a discharge position. CPU 16 controls multi-joint robot 24 to move conveyance pallet 40 from the processing position to the discharge position, loads conveyance pallet 40 on second conveyance section 22, then causes robot-side attachment section 27 to release the grip of pallet-side attachment section 42. Next, CPU 16 controls second conveyance section 22 to move conveyance pallet 40 to the outlet of the device. Then, CPU 16 determines whether there is a three-dimensional board to be processed next (S340), and if there is a next three-dimensional board, executes processing from S110. On the other hand, when there is no next three-dimensional board, that is, when the mounting process is completed for all three-dimensional boards, the routine ends. As described above, three-dimensional mounting device 11 corrects the application position and the mounting position by using the circuit pattern on the forming surface in an unapplied state as the reference position.

Next, correspondences between constituent elements of the present embodiment and constituent elements of the disclosure will be clarified. Multi-joint robot 24 of the present embodiment corresponds to a supporting section; application section 30 corresponds to an application section; mounting section 35 corresponds to a mounting section; imaging section 14 corresponds to an imaging section; imaging section 14, application section 30, and mounting section 35 correspond to a processing section; and control section 15 corresponds to a control section. With the present embodiment, an example of a three-dimensional mounting method of the present disclosure is also clear from the descriptions of operation of three-dimensional mounting device 11.

Three-dimensional mounting device 11 of the present embodiment described above performs imaging processing in which a three-dimensional board is fixed such that one forming surface in an unapplied state of the three-dimensional board, which is a processing target supported by multi-joint robot 24, becomes an imaging surface, and the forming surface is imaged. Similarly, with this device, fixing is performed such that one forming surface is to be an application surface, and coordinate correction is performed using the circuit pattern of the forming surface of the captured image as a reference position, and application processing for applying a viscous fluid is performed. Further, in this device, mounting processing is performed in which fixing is performed such that one forming surface is to be a mounting surface, and coordinate correction is performed using the circuit pattern of this forming surface of the captured image as a reference position, and components are arranged at arrangement positions to which the viscous fluid has been applied. Although the circuit pattern cannot be recognized after the viscous fluid has been applied, with this device, since the application processing and the mounting processing can be performed, the circuit pattern can be imaged before the application of the viscous fluid, and this image can be used for the application of viscous fluid and component arrangement after the application of the viscous fluid. Further, with this device, since the circuit pattern on the forming surface is used as the reference position, the coordinate correction of the application position of the viscous fluid and the arrangement position of the component P can be performed without arranging a special reference mark. Therefore, in this device, the viscous fluid can be applied to the surface of the three-dimensional object with higher accuracy, and the component P can be arranged on the surface of the three-dimensional object with higher accuracy. Further, this device is efficient because the captured image is used for both the coordinate correction of application processing and the coordinate correction of mounting processing.

Also, when arranging multiple components P on one forming surface, control section 15 performs coordinate correction of each component P by using the circuit pattern of the arrangement position of each respective component P as a reference position. The circuit pattern of the three-dimensional object may be formed by writing by a single stroke consecutively with other surfaces, and for example, high positional accuracy between a component and other components may not be expected in some cases. With this device, since coordinate correction is performed for each of the positions of the multiple components P to be arranged on the same forming surface, components P can be arranged on the surface of the three-dimensional object with higher accuracy. In addition, when applying the viscous fluid to one forming surface at multiple locations, control section 15 sets the circuit pattern at each application position as the respective reference position, and performs coordinate correction of each application position. With this device, the same effects as with mounting processing can be obtained with application processing.

In addition, control section 15 performs coordinate correction using an electrode (electrode pad) formed at a position where the component P is to be arranged as a reference position. Since the electrodes represent the positions at which the components P are to be arranged, the device enables the application of viscous fluid and the arrangement of components P to positions at which the components P should be arranged to a higher degree of accuracy. Further, control section 15 performs at least one of: a surface batch mode in which the processing of performing the imaging processing, the application processing, and the mounting processing for a single forming surface are performed in order with respect to multiple of the forming surfaces, a processing batch mode in which after performing imaging processing with respect to multiple of the forming surfaces, application processing is performed with respect to the multiple forming surfaces, then mounting processing is performed with respect to the multiple forming surfaces, and a combined mode in which the surface batch mode and the processing batch mode are mixed. In the surface batch mode, since each process is performed without changing the forming surface, it is easy to improve the accuracy of the arrangement position. In the processing batch mode, since the same device configuration is continuously used, the processing time can be easily shortened. In addition, in the combined mode, the accuracy of the arrangement position and the shortening of the processing time can be performed in a well-balanced manner.

Further, control section 15 sets the forming surface to be processed based on three-dimensional data 19 of the three-dimensional board, and fixes the three-dimensional board using multi-joint robot 24 such that the forming surface becomes the horizontal surface based on the inclination of the forming surface included in the three-dimensional data 19. With this device, since the component P is to be arranged on the horizontal forming surface, it is easy to apply the viscous fluid, and it is easy to arrange the component P. Furthermore, three-dimensional mounting device 11 includes a multi-joint robot that grips conveyance pallet 40 (a pedestal) to which a three-dimensional board is fixed as a processing target, and moves conveyance pallet 40 to a loading position, a processing position, and a discharge position. With this device, the multi-joint robot can be used to move or fix a processing target which is a three-dimensional object.

Meanwhile, it goes without saying that the present disclosure of a three-dimensional mounting device is not limited to the above-mentioned embodiments and various embodiments may be applied within the technical scope of the disclosure.

For example, in an embodiment described above, the attitude of the three-dimensional board as the processing target is changed by multi-joint robot 24, but the configuration is not particularly limited thereto as long as the three-dimensional board is supported and fixed such that the attitude is changeable. It should be noted that it is desirable to adopt the above-described multi-joint robot 24, for example, in the case of using a three-dimensional board long in the height direction, because the device can be made compact.

In an embodiment described above, the viscous fluid is applied to the three-dimensional object and the component P is arranged by changing the posture of the three-dimensional board which is the processing target, but it is also possible to fix the processing target, provide multiple tilt axes in one or more of the application section, the mounting section, and the imaging section, and perform an operation of tilting the tilt axes toward the processing target in multiple directions. For example, application head 32 may have a movable mechanism to change the angle of application nozzle 33, mounting head 37 may have a movable mechanism to change the angle of collection section 38, or there may be a movable section to change the angle of imaging section 14. With such a device also, by using the circuit pattern on the forming surface as the reference position, it is possible to arrange a component on a surface of a three-dimensional object with higher accuracy.

In an embodiment described above, when arranging multiple components on one forming surface, the circuit pattern at the arrangement position of each component is set as a respective reference position, but the configuration is not particularly limited thereto, and for example, a single circuit pattern may be used as the reference position for one forming surface. With such a device also, as in the case where a reference mark is provided on each forming surface, components can be arranged on the surface of the three-dimensional object with higher accuracy.

In an embodiment described above, the electrode pads formed at the positions where the components are to be arranged are used as the reference positions, but the configuration is not particularly limited thereto as long as the circuit patterns are arranged on the forming surface, and, for example, circuit wiring may be used.

In an embodiment described above, the surface batch mode, the processing batch mode, and the combined mode are performed selectively, but the configuration is not particularly limited thereto, and only one of these modes may be performed, and one or more of these modes may be omitted. With this device also, by using the circuit pattern on the forming surface as a reference position, it is possible to arrange a component on a surface of a three-dimensional object with higher accuracy.

In an embodiment described above, the coordinate correction of the application position of the viscous fluid is also performed by using the captured image of the forming surface in an unapplied state, but this may be omitted. With this device also, since the positional deviation correction is performed during mounting processing, it is possible to arrange the components on the surface of the three-dimensional object with higher accuracy.

In an embodiment described above, the forming surface to be processed is set and the inclination of the forming surface is corrected using three-dimensional data 19, but data other than three-dimensional data 19 may be used. Further, although control section 15 automatically recognizes the position of electrodes included in the captured image based on the arrangement position included in three-dimensional data 19, the configuration is not particularly limited thereto, and control section 15 may acquire the arrangement position set by an operator's input with reference to the electrode, and may perform subsequent positional deviation correction using the acquired arrangement position.

In an embodiment described above, mounting system 10 includes three-dimensional mounting device 11 and management PC 60, but the configuration is not limited thereto, and three-dimensional mounting device 11 may include functions of management PC 60. In an embodiment described above, the present disclosure has been described as three-dimensional mounting device 11, but a three-dimensional mounting method may be used.

Here, in a three-dimensional mounting device of the present disclosure, when arranging multiple components on one forming surface, the control section may perform coordinate correction of each component by using the circuit pattern of the arrangement position of each component as a respective reference position. The circuit pattern of the three-dimensional object may be formed by writing by a single stroke consecutively with other surfaces, and for example, high positional accuracy between a component and other components may not be expected in some cases. With this device, since coordinate correction is performed for each of the positions of the multiple components to be arranged on the same forming surface, components can be arranged on the surface of the three-dimensional object with higher accuracy.

In this three-dimensional mounting device, the control section may perform the coordinate correction by using an electrode formed at an arrangement position of the component as the reference position. Since the electrodes represent the position at which the component is to be arranged, with this device, components are arranged at the correct position with greater accuracy. Here, the control section may automatically recognize the electrodes included in the captured image to set the arrangement position, or the control section may acquire the arrangement position set by an input of the operator with reference to the electrodes.

With this three-dimensional mounting device, the control section may be configured to perform at least one of: a surface batch mode in which the processing of performing the imaging processing, the application processing, and the mounting processing for a single forming surface are performed in order with respect to multiple of the forming surfaces, a processing batch mode in which after performing imaging processing with respect to multiple of the forming surfaces, application processing is performed with respect to the multiple forming surfaces, then mounting processing is performed with respect to the multiple forming surfaces, and a combined mode in which the surface batch mode and the processing batch mode are mixed. In the surface batch mode, since each process is performed without changing the forming surface, it is easy to improve the accuracy of the arrangement position. In the processing batch mode, since the same device configuration is continuously used, the processing time can be easily shortened. In addition, in the combined mode, the accuracy of the arrangement position and the shortening of the processing time can be performed in a well-balanced manner.

In the three-dimensional mounting device, during application processing, the control section may perform coordinate correction using the circuit pattern of the forming surface of the captured image as a reference position, then may cause the application section to apply the viscous fluid. This device is efficient because the captured image is used for both the coordinate correction of application processing and the coordinate correction of mounting processing.

In the three-dimensional mounting device, the control section may set the forming surface of the processing target based on three-dimensional shape data of the processing target, and cause the supporting section to fix the processing target such that the forming surface becomes a horizontal surface based on an inclination of the forming surface included in the three-dimensional shape data. With this device, since the component is to be arranged on the horizontal forming surface, it is easy to apply the viscous fluid, and it is easy to arrange the component. Note that, when the forming surface on which the component is to be arranged is a curved surface, a tangential surface of the arrangement position may be a horizontal surface.

In the three-dimensional mounting device, the supporting section may be a multi-joint robot configured to grip a pedestal to which the processing target is fixed and move the pedestal to a loading position, a processing position, and a discharge position. With this device, the multi-joint robot can be used to move or fix a processing target which is a three-dimensional object. The multi-joint robot may be a vertical multi-joint robot.

A three-dimensional mounting method of the present disclosure is for applying a viscous fluid to and arranging components on a three-dimensional processing target having multiple forming surfaces on which a circuit pattern is formed, the three-dimensional mounting method using a processing section including a supporting section configured to fix the processing target, an applying section configured to apply the viscous fluid to the processing target, a mounting section configured to arrange the components on the processing target, and an imaging section configured to capture an image of the processing target, at least one of the supporting section, the applying section, the mounting section, and the imaging section having multiple tilt axes such that one or both of the processing target and the processing section is able to tilt in multiple directions, the three-dimensional mounting method including: supporting processing of causing the supporting section to support the processing target; imaging processing of fixing the processing target such that one of the forming surfaces of the processing target that is being supported by the supporting section becomes an imaging surface, the forming surface being in a state without anything having been applied to it, and causing the imaging section to image the forming surface; application processing of fixing the processing target such that one of the forming surfaces of the processing target that is being supported by the supporting section becomes an application surface, and causing the applying section to apply the viscous fluid to the forming surface; and mounting processing of fixing the processing target such that one of the forming surfaces of the processing target that is being supported by the supporting section becomes a mounting surface, performing coordinate correction using a circuit pattern of the forming surface imaged by the imaging section as a reference position, and causing the mounting section to arrange the component at an arrangement position on the circuit pattern on the forming surface on which the viscous fluid was applied.

With this three-dimensional mounting method, similar to with the above three-dimensional mounting device, since the circuit pattern on the forming surface is used as the reference position, the coordinate correction of the arrangement position of the component can be performed without arranging a special reference mark. Thus, the method allows the component to be more accurately arranged on the surface of a three-dimensional object. Note that, with this three-dimensional mounting method, various aspects of the three-dimensional mounting device described above may be used, or a configuration for realizing each function of the three-dimensional mounting device described above may be added.

INDUSTRIAL APPLICABILITY

The three-dimensional mounting device and the three-dimensional mounting method of the present disclosure may be applied to a device for performing processing such as collecting and arranging for a processing target that is a three-dimensional object.

REFERENCE SIGNS LIST

10: mounting system;
11: three-dimensional mounting device;
12: component supply section;
13: component camera;
14: imaging section;
15: control section;
16 CPU;
17: memory section;
19: three-dimensional data;
20: supporting and conveying section;
21: first conveyance section;
22: second conveyance section;
24: multi-joint robot;
25: base section;
26: arm section;
26a: first arm;
26b: second arm;
26c: third arm;
26d: fourth arm;
26e: fifth arm;
27: robot-side attachment section;
28: drive section;
29: movable space;
30: application section;
31: head moving section;
32: application head;
33: application nozzle;
35: mounting section;
36: head moving section;
37: mounting head;
38: collection section;
40: conveyance pallet;
41: fixing section;
42: pallet-side attachment section;
50: three-dimensional board;
51, 51a, 51b: forming surface;
52: circuit pattern;
55: three-dimensional board;
56, 56a, 56b, 56c: forming surface;
57: circuit pattern;
58: electrode pad;
59: viscous fluid;
60: management PC;
P: component

The invention claimed is:

1. A three-dimensional mounting device for applying a viscous fluid to and arranging components on a three-dimensional processing target having multiple forming surfaces on which a circuit pattern is formed, the three-dimensional mounting device comprising:
a supporting section configured to fix the processing target, the supporting section including a multi-joint robot including an arm section with a plurality of arms that are rotatably connected to each other end-to-end with the processing target fixed to an end most arm to allow the supporting section to tilt the processing target in multiple directions;
an applying section configured to apply the viscous fluid to the processing target, the applying section including an application head and an application nozzle mounted on the application head;
a mounting section configured to arrange the components on the processing target, the mounting section including a mounting head and a collection section mounted on the mounting head;
an imaging section configured to capture an image of the processing target; and
a control section configured to control a processing section including the supporting section, the applying section, the mounting section, and the imaging section, wherein
the control section is configured to cause the supporting section to support the processing target and to
set one of the forming surfaces of the processing target that is being supported by the supporting section and being free of the viscous fluid as a target forming surface,
control the supporting section so that the target forming surface is horizontal,
image the target forming surface using the imaging section,
calculate positional deviation of the circuit pattern on the target forming surface using the circuit pattern of the target forming surface imaged by the imaging section as a reference position, and memorize the positional deviation,
perform application position correction based on the positional deviation, and cause the applying section to apply the viscous fluid to the target forming surface with the application position correction when the processing target is being supported by the supporting section, and
perform mounting position correction based on the positional deviation, and cause the mounting section to arrange the component at an arrangement position on the circuit pattern on the target forming surface on which the viscous fluid was applied with the mounting position correction when the processing target is being supported by the supporting section.

2. The three-dimensional mounting device according to claim 1, wherein
when arranging multiple of the components on the target forming surface, the control section is configured to correct coordinates of the respective components by using the circuit pattern at the arrangement position of the respective components as the respective reference positions.

3. The three-dimensional mounting device according to claim 1, wherein
the control section is configured to calculate the positional deviation of the circuit pattern by using an electrode formed at the arrangement position of the component as the reference position.

4. The three-dimensional mounting device according to claim 1, wherein
the control section is configured to perform at least one of:
a surface batch mode,
a processing batch mode, and
a combined mode in which the surface batch mode and the processing batch mode are mixed.

5. The three-dimensional mounting device according to claim 1, wherein
the multi joint robot configured to grip a pedestal to which the processing target is fixed and move the pedestal to a loading position, a processing position, and a discharge position.

6. A three-dimensional mounting method for applying a viscous fluid to and arranging components on a three-dimensional processing target having multiple forming surfaces on which a circuit pattern is formed, the three-dimensional mounting method using a processing section including a supporting section configured to fix the processing target, the supporting section including a multi-joint robot including an arm section with a plurality of arms that are rotatably connected to each other end-to-end with the processing target fixed to an end most arm to allow the supporting section to tilt the processing target in multiple direction; an applying section configured to apply the viscous fluid to the processing target, the applying section including an application head and an application nozzle mounted on the application head; a mounting section configured to arrange the components on the processing target, the mounting section including a mounting head and a collection section mounted on the mounting head; and an imaging section configured to capture an image of the processing target, the three-dimensional mounting method comprising:

setting one of the forming surfaces of the processing target that is being supported by the supporting section and being free of the viscous fluid as a target forming surface, controlling the supporting section so that the target forming surface is horizontal;

imaging the target forming surface using the imaging section;

calculating positional deviation of the circuit pattern on the target forming surface using the circuit pattern of the target forming surface imaged by the imaging section as a reference position, and memorizing the positional deviation;

performing application position correction based on the positional deviation, and causing the applying section to apply the viscous fluid to the target forming surface with the application position correction when the processing target is being supported by the supporting section; and performing mounting position correction based on the positional deviation, and causing the mounting section to arrange the component at an arrangement position on the circuit pattern on the target forming surface on which the viscous fluid was applied with the mounting position correction when the processing target is being supported by the supporting section.

* * * * *